United States Patent [19]

Hsu et al.

[11] Patent Number: 5,646,431

[45] Date of Patent: Jul. 8, 1997

[54] SURFACE BREAKDOWN REDUCTION BY COUNTER-DOPED ISLAND IN POWER MOSFET

[75] Inventors: Ching-Hsiang Hsu; Da-Chi Kuo, both of Hsin-Chu, Taiwan

[73] Assignee: United Microelectronics Corporation, Hsin-Chu, Taiwan

[21] Appl. No.: 608,385

[22] Filed: Feb. 28, 1996

Related U.S. Application Data

[62] Division of Ser. No. 289,649, Aug. 12, 1994, Pat. No. 5,521,105.

[51] Int. Cl.$^6$ .................. H01L 29/76; H01L 29/94; H01L 31/062; H01L 31/113
[52] U.S. Cl. .................. 257/342; 257/408; 257/409; 257/339
[58] Field of Search .................. 257/342, 341, 257/408, 409, 345, 339; 437/29

[56] References Cited

U.S. PATENT DOCUMENTS

| | | | |
|---|---|---|---|
| 4,300,150 | 11/1981 | Colak | 257/339 |
| 4,717,679 | 1/1988 | Baliga et al. | 437/29 |
| 4,777,521 | 10/1988 | Coe | 257/339 |
| 4,990,982 | 2/1991 | Omoto et al. | 257/409 |
| 5,019,522 | 5/1991 | Meyer et al. | 437/29 |
| 5,023,678 | 6/1991 | Kinzer | 257/409 |
| 5,089,871 | 2/1992 | Fujihara | 257/408 |
| 5,258,636 | 11/1993 | Rumennik et al. | 257/341 |
| 5,294,824 | 3/1994 | Okada | 257/342 |
| 5,311,051 | 5/1994 | Tukizi | 257/339 |
| 5,378,912 | 1/1995 | Pein | 257/339 |

*Primary Examiner*—Stuart S. Levy
*Assistant Examiner*—Adriana Giordana
*Attorney, Agent, or Firm*—William H. Wright

[57] ABSTRACT

A metal oxide semiconductor field effect transistor with a lightly doped silicon substrate includes an oppositely doped well and oppositely doped source region and oppositely doped drain region with respect to the lightly doped substrate, the improvement comprising at least one counter doped region formed along the surface of the oppositely doped well between the source and drain regions. The substrate comprises a P-substrate, the well comprises an N-well and the counter doped region is doped P; the counter-doped region comprises an island among a plurality of islands between the source region and the drain region. The counterdoped region comprises an island among a plurality of islands between the source region and the drain region.

12 Claims, 6 Drawing Sheets

SURFACE BREAKDOWN REDUCTION BY COUNTER-DOPED ISLAND IN POWER MOSFET

This is a divisional of application Ser. No. 08/289,649, filed Aug. 12, 1994 and now U.S. Pat. No. 5,521,105.

BACKGROUND OF THE INVENTION

1. Field of the Invention

This invention relates to power MOSFET devices and more particularly to an improved design of such devices.

2. Description of Related Art

In current power MOSFET devices, in order to reduce the surface breakdown voltage, inclusion in the device of a thin diffused layer is required. The thin diffused layer results in the increase of "ON-resistance" because the width of the conduction path is reduced by this thin diffused layer. "ON-resistance", as employed here, refers to the resistance of the device when it is turned on. The breakdown occurs at a surface which requires less electrical field than the bulk of the semiconductor. The breakdown leads to a lowered dynamic resistance and higher currents. For high voltage device designs, the surface breakdown condition should be avoided.

U.S. Pat. No. 5,019,522 of Meyer et al shows a power transistor and methods for making that transistor.

SUMMARY OF THE INVENTION

In accordance with this invention a device comprises metal oxide semiconductor field effect transistor with a lightly doped silicon substrate including an oppositely doped well and oppositely doped source region and oppositely doped drain region with respect to the lightly doped substrate, the improvement comprising at least one counter doped region formed along the surface of the oppositely doped well between the source and drain regions.

Preferably, the substrate comprises a P-substrate, the well comprises an N− well and the counter doped region is doped P; the counterdoped region comprises an island among a plurality of islands between the source region and the drain region.

Preferably, the counterdoped region comprises an island among a plurality of islands between the source region and the drain region.

Preferably, the depth of the islands is within a range from about 3,000 Å to about 5,000 Å, the dopant in the counter doped region is applied at a range of energies from about 30 keV to about 50 keV, and a range of doses from about 1E12 $cm^{-2}$ to about 1E13 $cm^{-2}$; and preferably the dopant in the counter doped region being applied at an energy of about 40 keV with a dose of about 5E12 $cm^{-2}$ of $BF_2$ to provide a far higher level of doping than in the remainder of the well.

Preferably, the islands have a depth of about 3,000 Å, the dopant in the counter doped region being applied at an energy of about 40 keV with a dose of about 5E12 $cm^{-2}$ of $BF_2$ to provide a far higher level of doping than in the remainder of the N-well.

In accordance with another aspect of this invention, a method is provided for manufacture of a metal oxide semiconductor field effect transistor device with a lightly doped silicon substrate including an oppositely doped well and oppositely doped source region and oppositely doped drain region with respect to the lightly doped substrate, the improvement comprising implanting dopant into at least one counter doped region formed along the surface of the well between the source and drain regions.

Preferably, the substrate comprises a P-substrate, the well comprises an N− well, and the counter doped region is doped P; the counterdoped region comprises an island among a plurality of islands between the source region and the drain region; the substrate comprises a P-substrate, the well comprises an N− well and the counter doped region is doped P, and the counterdoped region comprises an island among a plurality of islands between the source region and the drain region.

Preferably, the depth of the islands is within a range from about 3,000 Å to about 5,000 Å, the dopant in the counter doped region is applied at a range of energies from about 30 keV to about 50 keV, and a range of doses from about 1E12 $cm^{-2}$ to about 1E13 $cm^{-2}$; and preferably, the dopant in the counter doped region being applied at an energy of about 40 keV with a dose of about 5E12 $cm^{-2}$ of $BF_2$ to provide a far higher level of doping than in the remainder of the N-well.

Preferably, the islands have a depth of about 3,000 Å, the dopant in the counter doped region being applied at an energy of about 40 keV with a dose of about 5E12 $cm^{-2}$ of $BF_2$ to provide a far higher level of doping than in the remainder of the N-well.

In accordance with still another aspect of this invention, a metal oxide semiconductor field effect transistor device with a lightly doped silicon substrate includes an oppositely doped well and oppositely doped source region and oppositely drain region with respect to the lightly doped substrate, manufactured by the method comprising implanting at least one counter doped region formed along the surface of the well between the source and drain regions.

Preferably, the substrate comprises a P-substrate, the well comprises an N− well and the counter doped region is doped P; the counterdoped region comprises an island among a plurality of islands between the source region and the drain region.

BRIEF DESCRIPTION OF THE DRAWINGS

The foregoing and other aspects and advantages of this invention are explained and described below with reference to the accompanying drawings, in which:

FIG. 2A shows a P doped silicon substrate covered with a thin film gate oxide layer, a silicon nitride ($Si_3N_4$) layer and a photoresist layer for formation of an N-well.

FIG. 2B shows the device of FIG. 2A after a thin film gate oxide layer, a silicon nitride layer and a photoresist layer have been formed for the formation of islands in the N-well.

FIG. 2C shows the device of FIG. 2B after FOX regions are formed over the P islands.

FIG. 2D shows the device of FIG. 2C after a new gate oxide layer is formed on top of the P-sub and the N-well and a FOX region, and a polysilicon layer deposited upon the gate oxide layer, upon which is deposited a photoresist mask for patterning the polysilicon gate which gate is formed by etching using the mask to protect the gate, and the portions of the gate oxide layer not covered by the gate are etched away.

FIG. 2E shows the device of FIG. 2D after the patterning of the gate and removal of the mask using the gate, followed by a self-aligned ion implantation of N+ doped source region located to the left of the N-well in the P-sub forming a source region and a drain region followed by implanting dopant composed of phosphorus ions through the exposed surface of the substrate into N+ regions.

FIG. 2F shows the device of FIG. 2E after the deposition of a dielectric layer, covered with a mask with openings therein through which aligned openings have been formed by etching a dielectric layer through openings to form corresponding openings down to the substrate and N-well on the left and the right respectively between FOX regions over the substrate and over the N-well.

FIG. 2G shows the device of FIG. 2F after the metallization for contacts is deposited in openings in contact with the source and the drain by use of a conventional metallization process with the contact extending over the surface of the dielectric layer.

FIG. 3A shows a P doped silicon substrate covered with a thin film gate oxide layer, a silicon nitride ($Si_3N_4$) layer and a photoresist layer for formation of an N-well.

FIG. 3B shows the device of FIG. 3A after a thin film gate oxide layer, a silicon nitride layer and a photoresist layer have been formed for the formation of islands in the N-well.

FIG. 3C shows the device of FIG. 3B after FOX regions are formed over the P islands.

FIG. 3D shows the device of FIG. 3C after a new gate oxide layer is formed on top of the P-sub and the N-well where the FOX regions are absent, and a polysilicon layer deposited upon the gate oxide layer, upon which is deposited a photoresist mask for patterning the polysilicon gate which gate is formed by etching using the mask to protect the gate, and the portions of the gate oxide layer not covered by the gate are etched away.

FIG. 3E shows the device of FIG. 3D after the patterning of the gate and removal of the mask using the gate, followed by a self-aligned ion implantation of N+doped source region located in the P-sub forming a source region and a drain region followed by implanting dopant composed of phosphorus ions through the exposed surface of the substrate forming N+ regions.

FIG. 3F shows the device of FIG. 3E after the deposition of a dielectric layer, covered with a mask with openings therein through which aligned openings have been formed by etching a dielectric layer through openings to form corresponding openings down to the N+ regions.

FIG. 3G shows the device of FIG. 3F after the metallization for contacts is deposited in openings in contact with the source and the drain by use of a conventional metallization process with the contact extending over the surface of the dielectric layer.

DESCRIPTION OF THE PREFERRED EMBODIMENT

This invention provides a counter-doped island or stripe between the source and the drain of a MOSFET device to reduce the surface high field while maintaining a thicker diffused layer which reduces the "ON resistance." Counter-doping refers to using a P dopant in an N-well. Alternatively, it could refer to using an N dopant in a P-well, if that were the embodiment being employed. The dimensions of the stripe depend upon the sustained voltage range. The voltage is up to 800 V with a current of 1 Ampere to 2 Amperes, fully integrated.

Figure 1:
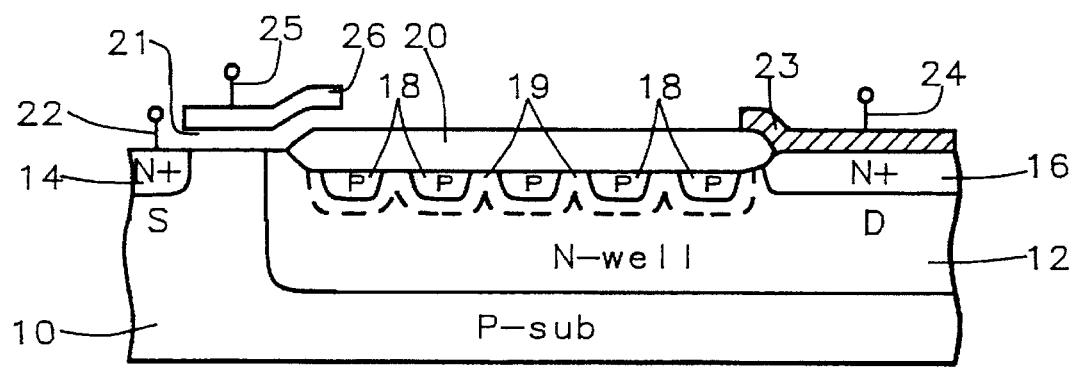
FIG. 1 shows a device with a P doped silicon substrate containing N+ source and drain regions, the substrate also including an N-well with a number of P islands formed along the surface of the N-well between the source region and the drain region, the P islands have been formed along with the N+ region, and the islands are not connected to any electrodes and are at floating potentials.

Referring to FIG. 1, a P doped silicon substrate 10 contains N+ source and drain regions. The substrate 10 also includes an N-well 12 in which a number of P islands 18 were formed along the surface of the N-well between the source region and the drain region. P islands 18 have been formed along with the N+ region 16. The islands 18 are not connected to any electrodes and are at floating potentials. Preferably, the islands 18 are of variable diameters at a depth of 3,000 Å. The depth is within a range from about 3,000 Å to about 5,000 Å.

Formation of islands 18 was performed by implanting dopant composed of $BF_2$ ions into regions where islands 18 were formed. The dopant was applied at a preferred dose of $1E12\ cm^{-2}$ of $BF_2$ at a preferred energy of 40 keV to provide a far higher level of doping than in the remainder of the N-well 12. A range of energies from about 30 keV to about 50 keV is possible. A range of doses from about $1E12\ cm^{-2}$ to about $1E13\ cm^{-2}$ is possible.

The regions 19 are marked off by dotted lines because of the depletion between the N-well and P– islands.

Above the islands 18 and regions 19, a FOX region 20 is formed.

The N+ doped source region 14 is located to the left of the N-well 12 in the P-sub 10. Bridging the source region 14 and the N-well 12 above a gate oxide dielectric 21 is an electrode 26 connected to terminal 25. Source region 14 is connected to electrode 22. Above the N+ drain region 16 to the right of the islands 18 is a polysilicon electrode 23 (formed on the surface of region 16 and FOX region 20) connected to terminal 24. When a high voltage is applied to the drain terminal 24, a large degree of depletion will be formed among the islands 18 and the N-well 12.

The depletion between the counter-doped islands 18 and the N-well can perform the functions as follows:
 i) reduce the surface electrical field,
 ii) result in full depletion in the diffused layer.
Therefore, the breakdown voltage can be increased.

Process of Manufacture of Power MOSFET with Counter-Doped Islands

Implant N-well and drive in of Implanted N-well Ions

Figure 2A:
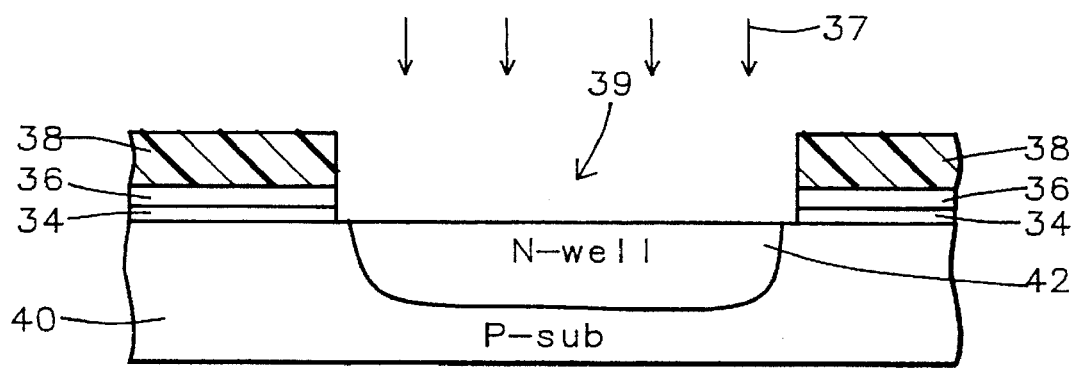
FIGS. 2A–2G show a series of steps in the process of manufacture of a device in accordance with this invention.

Referring to FIG. 2A, a P doped silicon substrate 40 has been covered with a thin film gate oxide layer 34, a silicon nitride ($Si_3N_4$) layer 36 and a photoresist layer 38. The photoresist layer 38 was photolithographically exposed, patterned and developed and the $Si_3N_4$ layer 36 and the photoresist layer 38 have been etched to form opening 39. Dopant 37 composed of phosphorus ions are implanted through the opening 39 to form N-well 42. The dopant 37 is applied at a preferred dose of $5E10\ cm^{-2}$ of phosphorus at a preferred energy of 250 keV to provide a far higher level of doping than in the remainder of P-sub 40. A range of energies from about 250 keV to about 300 keV is possible. A range of doses from about $1E10\ cm^{-2}$ to about $5E10\ cm^{-2}$ is possible.

Photoresist layer 38, silicon nitride ($Si_3N_4$) layer 36, and thin film gate oxide layer 34 are removed after formation of N-well 42.

P-island implant into N-well

Figure 2B:
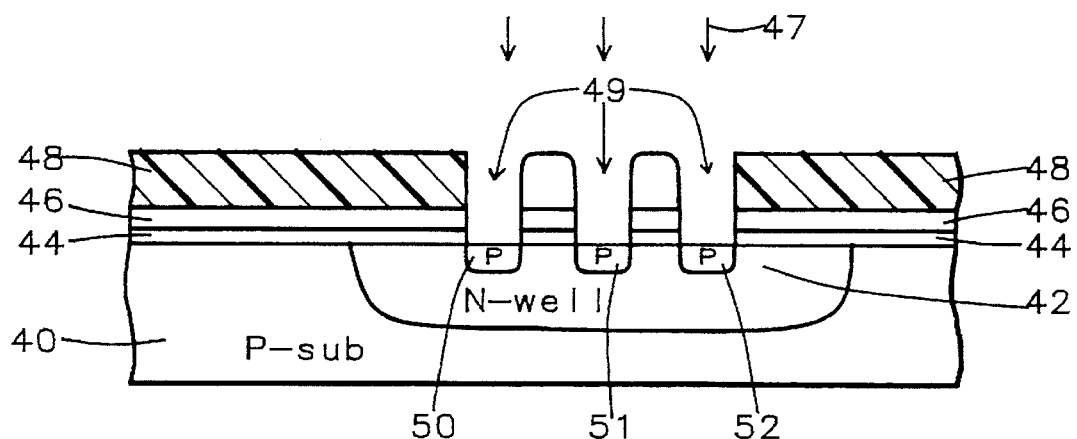

Referring to FIG. 2B, a thin film gate oxide layer 44, a silicon nitride ($Si_3N_4$) layer 46 and a photoresist layer 48 have been formed. The photoresist layer 48 was photolithographically exposed, patterned and developed and the $Si_3N_4$ layer 46 and the photoresist layer 48 have been etched to form openings 49. Then, a number of counter-doped P islands 50, 51 and 52 have been formed.

Preferably, the islands 50, 51 and 52 are of 3,000 Å depth. The depth is within a range from about 3,000 Å to about 5,000 Å.

To form the islands, dopant composed of $BF_2$ ions 47 are implanted through the openings 49 into islands 50, 51 and 52. The dopant is applied at a preferred dose of 1E12 $cm^{-2}$ of $BF_2$ at a preferred energy of 40 keV to provide a counter level of doping to the remainder of N-well 42. A range of energies from about 30 keV to about 50 keV is possible. A range of doses from about 1E12 $cm^{-2}$ to about 1E13 $cm^{-2}$ is possible.

Grow Field Oxide and Drive in P– Island.

Figure 2C:
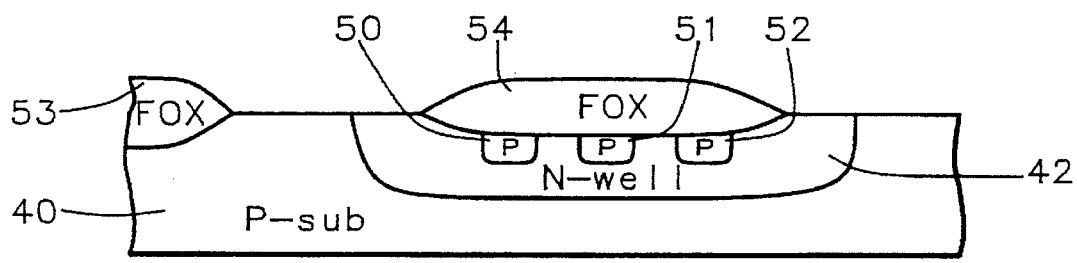

Referring to FIG. 2C, FOX regions 53 and 54 are formed by a conventional field oxide process. FOX regions 53 and 54 are formed over the P islands. Wet oxidation is employed to form a field oxide (FOX) 54 layer of silicon dioxide 6,000 Å thick. Field implant is done at the same time as the P– island implant by heating to about 950° C.

Grow Gate Oxide and Deposit Polysilicon

Figure 2D:
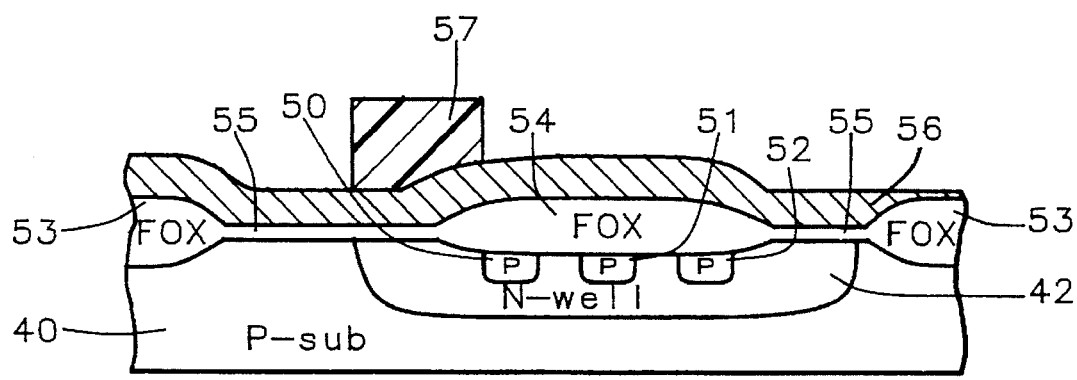

FIG. 2D shows a new gate oxide layer 55 formed on top of the P-sub 40 and the N-well 42 and the FOX region 54. Polysilicon layer 56 is deposited upon the gate oxide layer 55.

Pattern Polysilicon Gate

Upon polysilicon layer 56 is deposited a photoresist mask 57 for patterning the polysilicon gate 56. The gate 56 is formed by etching using the mask 57 to protect the gate 56. In addition, the portions of the gate oxide layer 55 not covered by the gate 56 are etched away.

Perform Source/Drain Self-Aligned Implant.

Figure 2E:
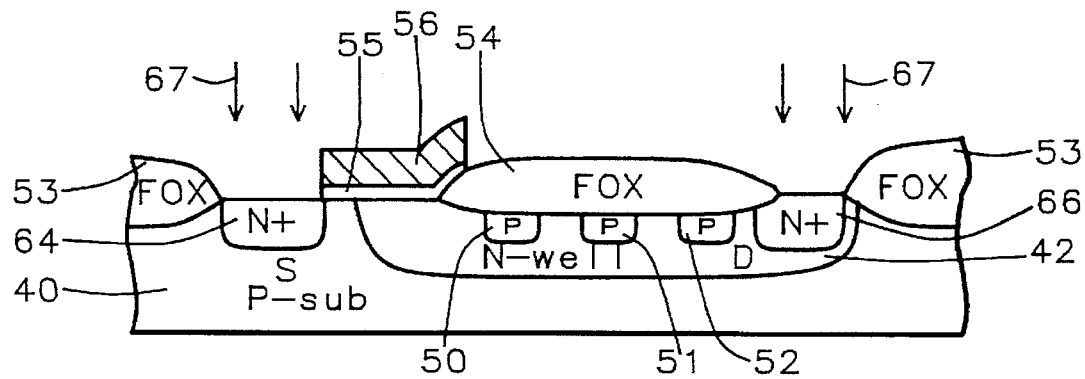

FIG. 2E shows the device of FIG. 2D after the patterning of the gate 56 and removal of the mask 57. Then using the gate 56, the next step is a self-aligned ion implantation of N+ doped source region 64 located to the left of the N-well 42 in the P-sub 40 which is performed forming the source region 64 and the drain region 66. Dopant 67 composed of phosphorus ions is implanted through exposed surface of the substrate 40 into N+ regions 64 and 66. The dopant 67 is applied at a preferred dose of 5E15 $cm^{-2}$ of P (phosphorus) at a preferred energy of 25 keV to provide a far higher level of doping than in the remainder of P-sub 40 and N-well 42 respectively. A range of energies from about 20 keV to about 30 keV is possible. A range of doses from about 1E15 $cm^{-2}$ to about 5E15 $cm^{-2}$ is possible.

Bridging the source region 64 and the N-well 42 above gate oxide is gate electrode 56.

Figure 2F:
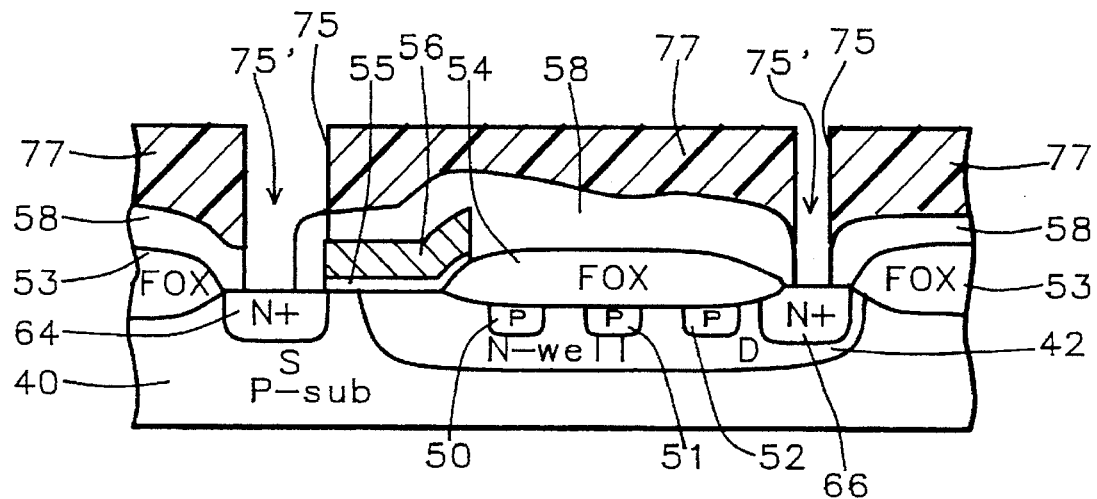

FIG. 2F shows the device of FIG. 2E after the deposition of a dielectric layer 58 composed of a material such as BPSG, covered with a mask 77 with openings 75 therein through which aligned openings 77' have been formed by etching dielectric layer 58 through openings 77' to form corresponding openings 75' therein down to substrate 40 and N-well 42 on the left and the right respectively between FOX regions 53 over the substrate and 54 over the N-well 42.

Figure 2G:
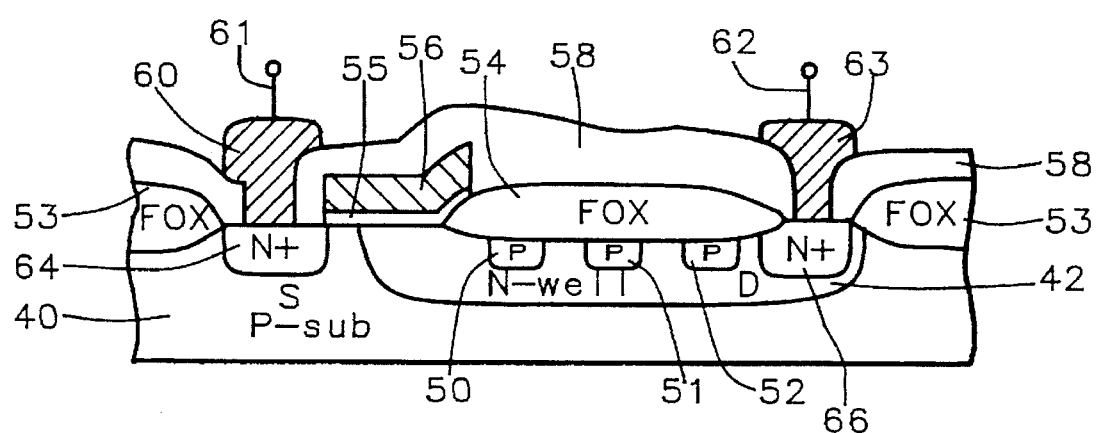

FIG. 2G shows the device of FIG. 2F after the metallization for contacts 60 and 62 is deposited in openings 75' in contact with the source 64 and the drain 66 by use of a conventional metallization process with the contact extending over the surface of the dielectric layer 58 with a mushroom shaped cross section. A terminal 61 is formed on contact 60 and terminal 63 is formed on contact 62. Thus, source region 64 is connected to terminal 61 through contact electrode 60, and above the N+ drain region 66 to the right of the islands 50, 51 and 52, electrode 62 is connected to terminal 63. When a high voltage is applied to the drain terminal 63, a large degree of depletion will be formed among the islands 50, 51 and 52 and the N-well 42.

Process of Manufacture of Peripheral Device to Power MOSFET with Counter-Doped Islands

Implant N-well and drive in Implanted Ions

Figure 3A:
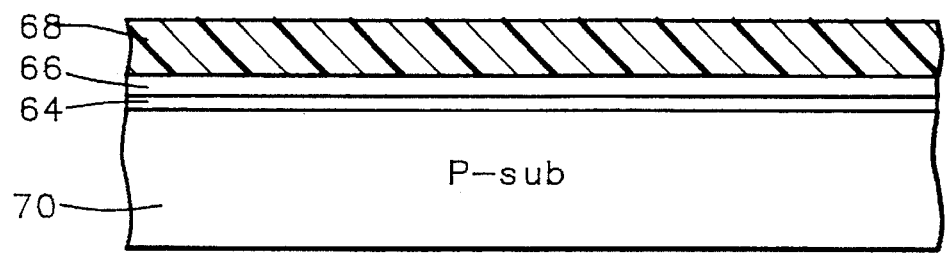
FIGS. 3A–3G show a series of steps in accordance with the method of this invention of manufacturing of a peripheral device.

Referring to FIG. 3A, a P doped silicon substrate 70 a thin film gate oxide layer 64, a silicon nitride ($Si_3N_4$) layer 66 and photoresist layer 68 have been formed. Photoresist layer 68 was photolithographically exposed, patterned and developed and the $Si_3N_4$ layer 36 and the photoresist layer 38 which is newly formed after N-well formation in other areas of the device since in a CMOS device the N-wells are needed for the P-MOSFET. Photoresist layer 68 is stripped and then silicon nitride ($Si_3N_4$) 66 and thin film gate oxide layer 64 are removed by conventional techniques.

Field Implant for Peripheral N-MOS Devices

Figure 3B:
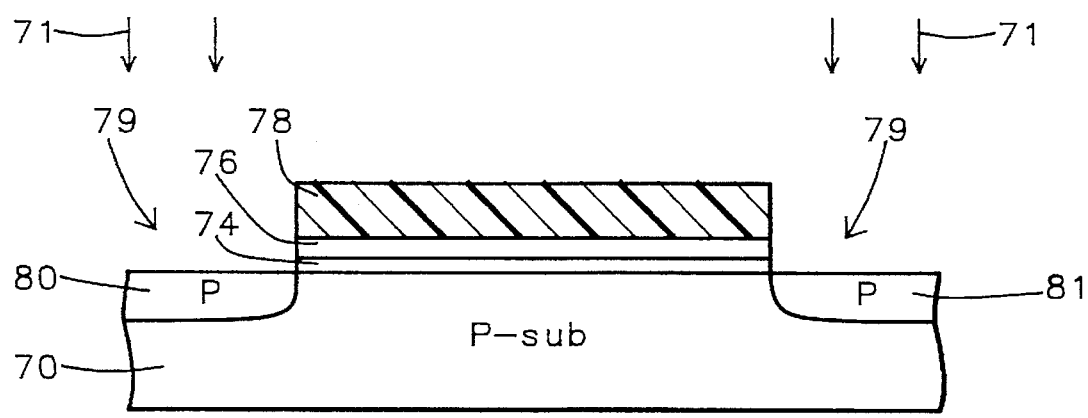

Referring to FIG. 3B, a thin film gate oxide layer 74, a silicon nitride ($Si_3N_4$) layer 76 and a photoresist layer 78 have been formed. The photoresist layer 48 was photolithographically exposed, patterned and developed and the $Si_3N_4$ layer 46 and the photoresist layer 48 have been etched to form openings 79. Then, P doped regions for islands 80 and 81 are formed by implanting dopant 71 into openings 79.

Preferably, the islands 80, 81 are of a depth of 3,000 Å. The depth is within a range from about 3,000 Å to about 5,000 Å.

Dopant composed of $BF_2$ ions 71 are implanted through the openings 79 into zones 80 and 81 of P-sub 70. The dopant ions 71 are applied at a preferred dose of 1E12 $cm^{-2}$ of $BF_2$ at a preferred energy of 40 keV to provide a far higher level of doping than in the remainder of the P-sub 70. A range of energies from about 30 keV to about 50 keV is possible. A range of doses from about 1E13 $cm^{-2}$ to about 1E13 $cm^{-2}$ is possible.

Grow Field Oxide and Drive in P– Island.

Figure 3C:
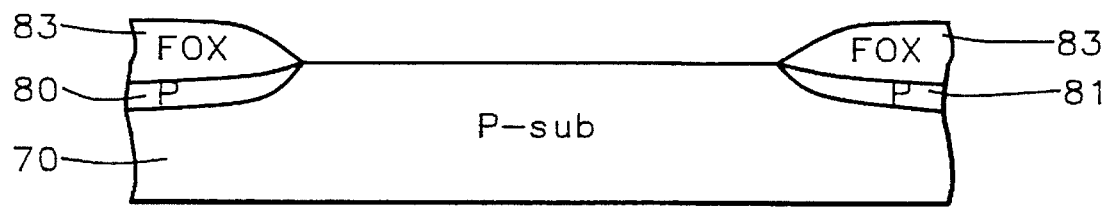

Referring to FIG. 3C, FOX regions 83 are formed by a conventional field oxide process over the P doped regions 80 and 81.

Grow Gate Oxide and Deposit Polysilicon

Figure 3D:
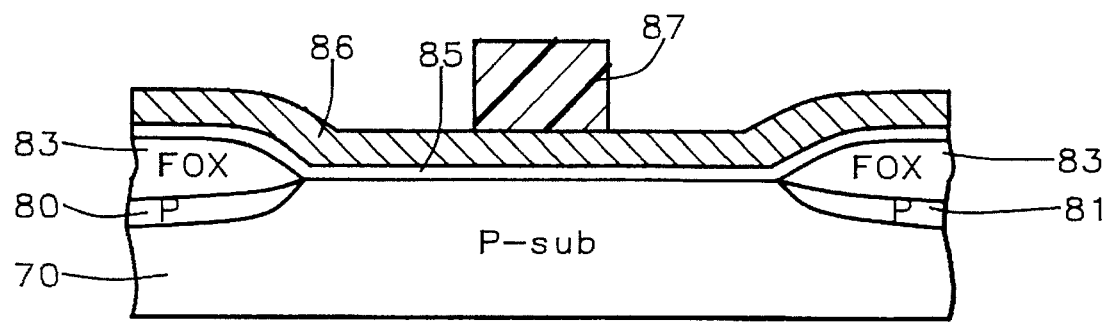

FIG. 3D shows a new gate oxide layer 85 formed on top of the P-sub 70 and the FOX regions 83. Polysilicon layer 86 is deposited upon the gate oxide layer 85.

Pattern Polysilicon Gate

Then a photoresist mask 87 is formed over the layer 86 and patterned photolithographically to cover the area where the gate 86 is to be formed. Then using the mask 87, the polysilicon layer 86 remaining exposed is etched away leaving the gate 86 as seen in FIG. 3E, and the remainder of the gate oxide layer 85 is also etched away also aside from beneath the gate 86.

Perform Source/Drain Self-Aligned Implant

Figure 3E:
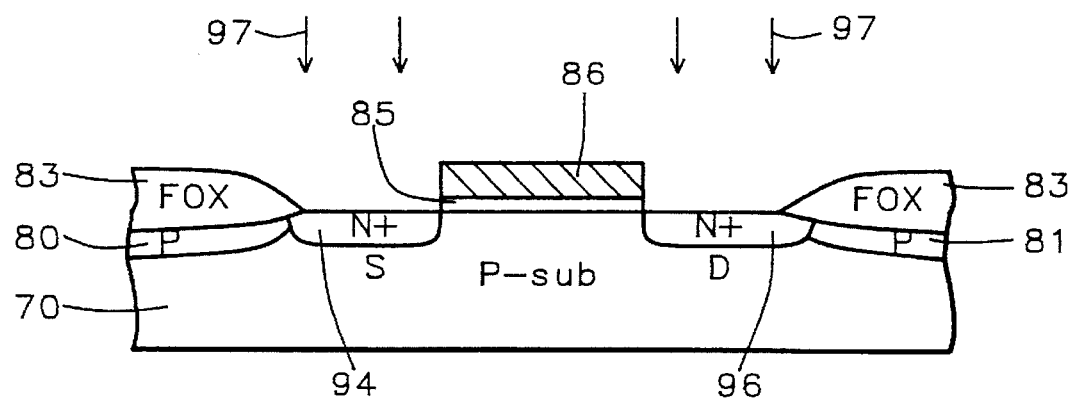

FIG. 3E also shows an N+ doped source region 94 located on the left and an N+ doped drain region 96 located on the right. Dopant composed of phosphorus ions 97 are implanted in a self-aligned implant (as in FIG. 2E) between FOX regions 83 and the gate 86. The dopant 97 is applied at a preferred dose of $5E15 cm^{-2}$ of phosphorus at a preferred energy of 30 keV to provide a far higher level of doping than in the remainder of P-sub 70. A range of energies from about 25 keV to about 35 keV is possible. A range of doses from about $1E15 cm^{-2}$ to about $5E15 cm^{-2}$ is possible.

Figure 3F:
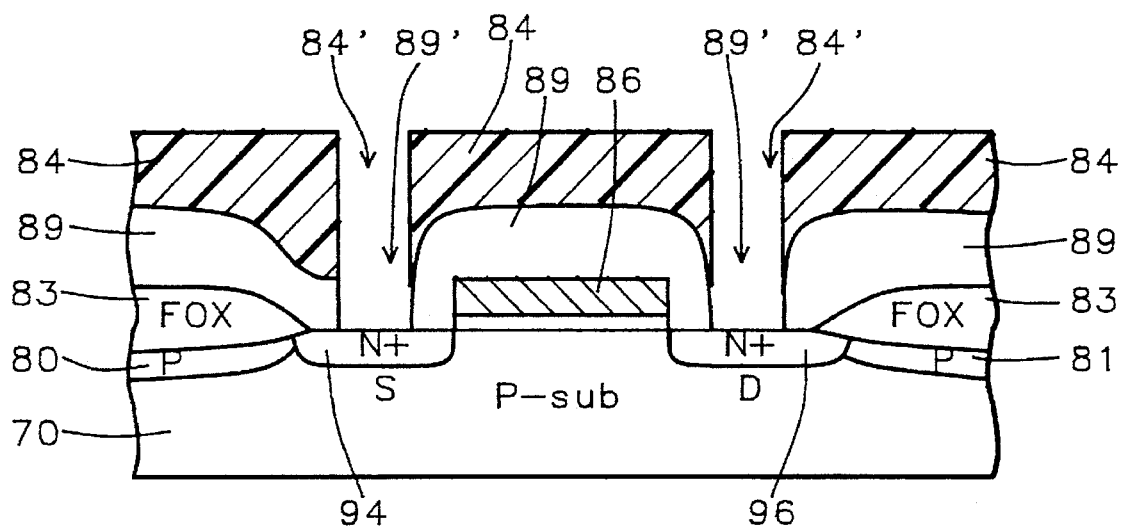

FIG. 3F shows the device of FIG. 3E after the deposition of a dielectric layer 89 composed of a material such as BPSG, covered with a mask 84 with openings 84' therein through which aligned openings 84' have been formed by etching dielectric layer 89 through openings 84' to form corresponding openings 89' therein down to source region 94 N-well on the left and drain region 96 on the right respectively.

Figure 3G:
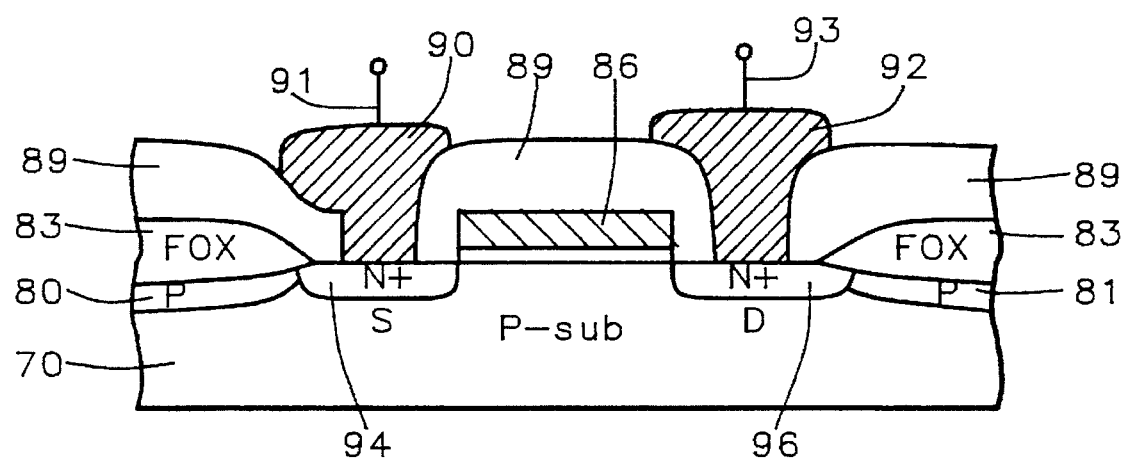

FIG. 3G shows the device of FIG. 3F after the mask 84 has been removed and after metallization for contacts 90 and 92 is deposited in openings 89' in contact with the source 94 and the drain 96 by use of a conventional metallization process with the contact extending over the surface of the dielectric layer 89 with a mushroom shaped cross section. A terminal 91 is formed on contact 90 and terminal 93 is formed on contact 92. Thus, source region 94 is connected to terminal 91 through contact electrode 90, and above the N+ drain region 96 to electrode 92 is connected to terminal 93.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. In a metal oxide semiconductor field effect transistor device with a substrate having at least a surface layer doped to a first conductivity type, the device including a well within the surface layer doped to a second conductivity type and source and drain regions doped to said first conductivity type, the improvement comprising a plurality of counter-doped regions formed in said well along a surface of said well and spaced apart in a direction parallel to a conduction path between said source and drain regions.

2. A device in accordance with claim 1 wherein said substrate comprises a P-substrate, said well comprises an N-well and said counter-doped regions are doped P.

3. A device in accordance with claim 2 further comprising a field oxide region extending over said counter-doped regions, wherein said counter-doped regions extend a depth into said substrate below said field oxide region and, when a voltage is applied to the drain region, said conduction path is displaced below said depth of said counter-doped regions.

4. A device in accordance with claim 3 wherein said depth of said counter-doped regions is within a range from about 3,000 Å to about 5,000 Å, and the dopant in said counter-doped regions is applied at a range of energies from about 30 keV to about 50 keV, and a range of doses from about $1E12 cm^{-2}$ to about $1E13 cm^{-2}$.

5. A device in accordance with claim 3 wherein said depth of said counter-doped regions is about 3,000 Å, and the dopant in said counter-doped region is applied at an energy of about 40 keV with a dose of about $5E12 cm^{-2}$ of $BF_2$ to provide a far higher level of doping than in other regions of said N-well.

6. A device in accordance with claim 1 wherein said counter-doped regions extend a depth into said substrate and said counter-doped regions are spaced apart along said conduction path by a distance such that, when a voltage is applied to the drain region, said surface of said well is depleted between said counter-doped regions and said conduction path is displaced below said depth of said counter-doped regions.

7. A device in accordance with claim 6 wherein said depth of said counter-doped regions is within a range from about 3,000 Å to about 5,000 Å, and the dopant in said counter-doped regions is applied at a range of energies from about 30 keV to about 50 keV, and a range of doses from about $1E12 cm^{-2}$ to about $1E13 cm^2$.

8. A device in accordance with claim 6 wherein said depth of laid counter-doped regions is from about 3,000 Å to about 5,000 Å, and the dopant in said counter doped region is applied at an energy of about 40 keV with a dose of about $5E12 cm^{-2}$ of $BF_2$ to provide a far higher level of doping than other regions in said well.

9. The device of claim 1, further comprising a gate electrode formed over a region of said surface layer extending between said source and said well.

10. The device of claim 9, wherein at least some of the counter-doped regions are not covered by said gate electrode.

11. The device of claim 10, wherein the counter-doped regions are at floating potentials during operation.

12. The device of claim 1, wherein the counter-doped regions are at floating potentials during operation.

* * * * *